(12) United States Patent
Hikosaka et al.

(10) Patent No.: US 10,923,349 B2
(45) Date of Patent: Feb. 16, 2021

(54) SEMICONDUCTOR ELEMENT AND METHOD FOR MANUFACTURING THE SAME

(71) Applicant: KABUSHIKI KAISHA TOSHIBA, Minato-ku (JP)

(72) Inventors: Toshiki Hikosaka, Kawasaki (JP); Jumpei Tajima, Mitaka (JP); Shinya Nunoue, Ichikawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/284,059

(22) Filed: Feb. 25, 2019

(65) Prior Publication Data

US 2019/0355580 A1  Nov. 21, 2019

(30) Foreign Application Priority Data

May 18, 2018 (JP) .............................. JP2018-095903

(51) Int. Cl.
*H01L 21/02* (2006.01)
*H01L 29/20* (2006.01)
*H01L 29/205* (2006.01)
*H01L 29/207* (2006.01)
*H01L 29/32* (2006.01)
(Continued)

(52) U.S. Cl.
CPC .... *H01L 21/02658* (2013.01); *H01L 21/0254* (2013.01); *H01L 21/0262* (2013.01); *H01L 21/02458* (2013.01); *H01L 29/2003* (2013.01); *H01L 29/205* (2013.01); *H01L 29/207* (2013.01); *H01L 29/32* (2013.01); *H01L 29/7787* (2013.01); *H01L 33/0075* (2013.01); *H01L 33/025* (2013.01); *H01L 33/12* (2013.01); *H01L 33/32* (2013.01); *H01L 33/325* (2013.01)

(58) Field of Classification Search
CPC ........... H01L 21/02458; H01L 21/0254; H01L 21/26; H01L 21/263; H01L 29/2003; H01L 33/0075
See application file for complete search history.

(56) References Cited

U.S. PATENT DOCUMENTS 8,680,508 B2 *  3/2014  Hikosaka ............... H01L 33/06
                                                    257/14
8,859,313 B2 * 10/2014  Sakai .................... H01L 33/007
                                                    438/37
(Continued)

FOREIGN PATENT DOCUMENTS

JP  2002-94112   3/2002
JP  2009-200523  9/2009
(Continued)

*Primary Examiner* — David C Spalla
(74) *Attorney, Agent, or Firm* — Oblon, McClelland, Maier & Neustadt, L.L.P.

(57) ABSTRACT

According to one embodiment, a semiconductor element includes a first nitride semiconductor region, a second nitride semiconductor region, and an intermediate region provided between the first nitride semiconductor region and the second nitride semiconductor region. A Si concentration in the intermediate region is not less than $1 \times 10^{18}/cm^3$ and not more than $1 \times 10^{19}/cm^3$. A charge density in the intermediate region is $3 \times 10^{17}/cm^3$ or less.

31 Claims, 11 Drawing Sheets

(51) Int. Cl.
*H01L 29/778* (2006.01)
*H01L 33/00* (2010.01)
*H01L 33/02* (2010.01)
*H01L 33/12* (2010.01)
*H01L 33/32* (2010.01)

(56) References Cited

U.S. PATENT DOCUMENTS

| | | | |
|---|---|---|---|
| 9,666,705 B2* | 5/2017 | Prechtl | H01L 29/452 |
| 2003/0218183 A1* | 11/2003 | Micovic | H01L 21/28575 |
| | | | 257/192 |
| 2010/0187540 A1 | 7/2010 | Ishibashi et al. | |
| 2011/0133209 A1 | 6/2011 | Ishibashi et al. | |
| 2012/0146728 A1* | 6/2012 | Makiyama | H01L 29/66462 |
| | | | 330/277 |
| 2012/0217505 A1* | 8/2012 | Ando | H01L 29/7786 |
| | | | 257/76 |
| 2013/0234151 A1 | 9/2013 | Hikosaka et al. | |
| 2013/0237036 A1 | 9/2013 | Hikosaka et al. | |
| 2015/0200255 A1 | 7/2015 | Hikosaka et al. | |
| 2017/0179271 A1* | 6/2017 | Fenwick | H01L 29/66462 |
| 2017/0179281 A1* | 6/2017 | Chan | H01L 21/02538 |

FOREIGN PATENT DOCUMENTS

| | | |
|---|---|---|
| JP | 2009-246038 | 10/2009 |
| JP | 2013-187427 | 9/2013 |
| JP | 2013-187428 | 9/2013 |
| JP | 2015-133443 | 7/2015 |
| JP | 2017-59598 | 3/2017 |

* cited by examiner

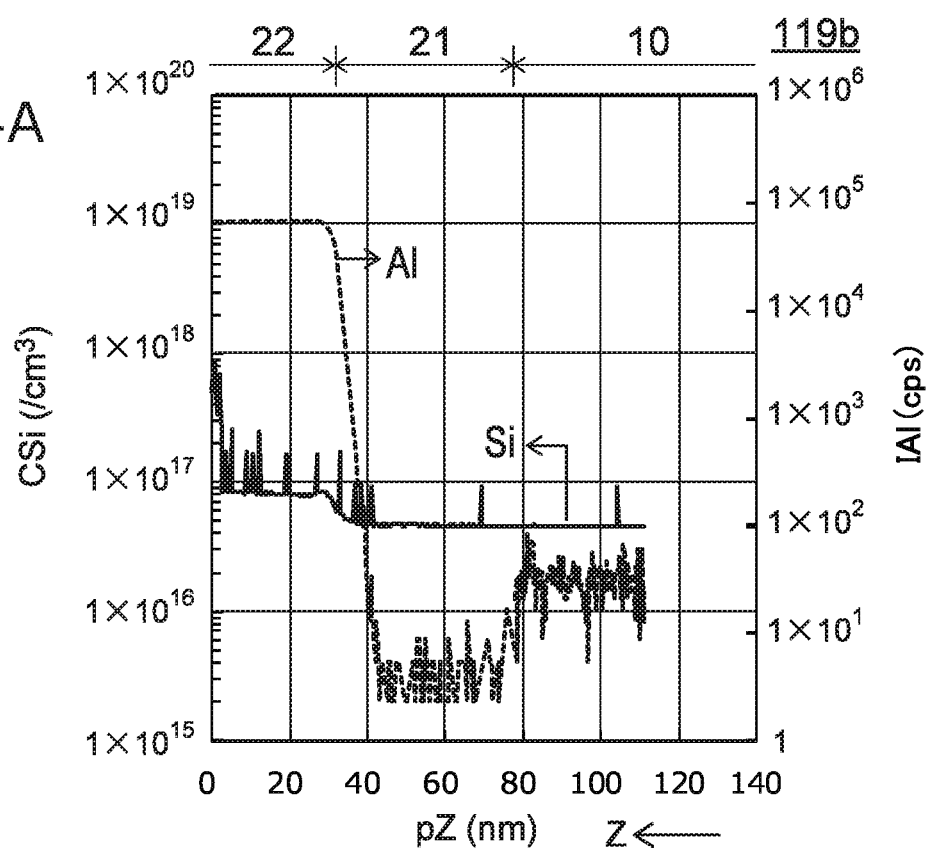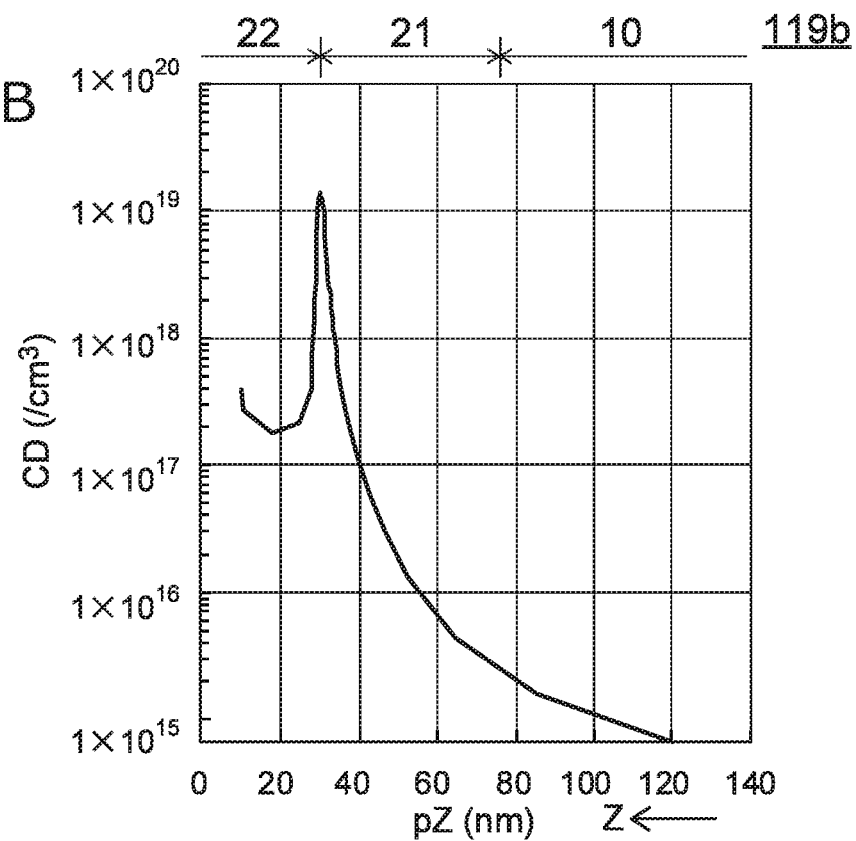

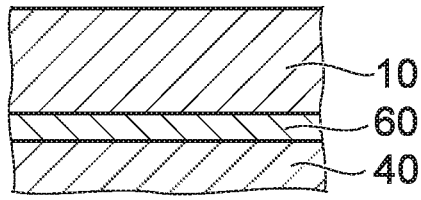
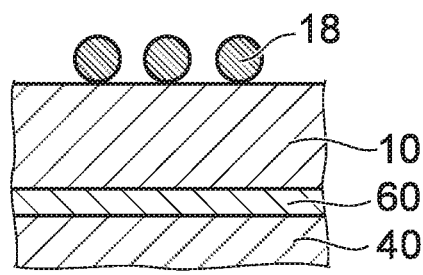
FIG. 9A  FIG. 9B
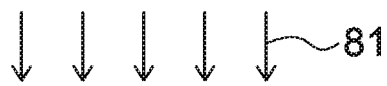
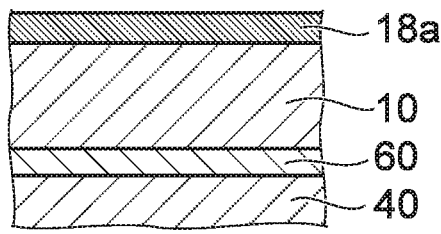
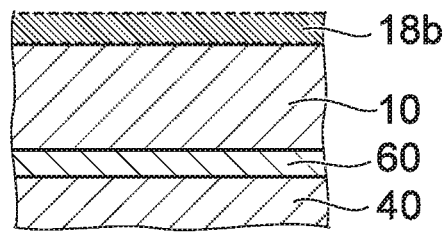
FIG. 9C  FIG. 9D
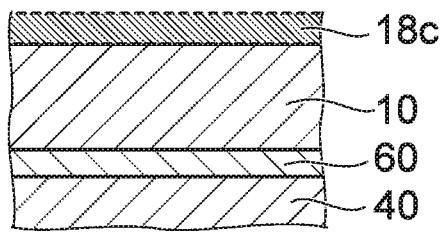
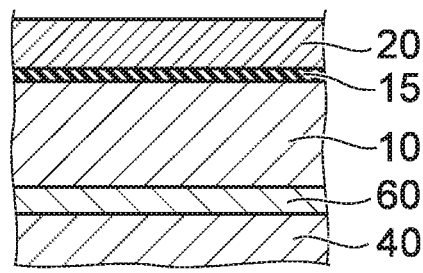
FIG. 9E  FIG. 9F

SEMICONDUCTOR ELEMENT AND METHOD FOR MANUFACTURING THE SAME

CROSS-REFERENCE TO RELATED APPLICATIONS

This application is based upon and claims the benefit of priority from Japanese Patent Application No. 2018-095903, filed on May 18, 2018; the entire contents of which are incorporated herein by reference.

FIELD

Embodiments described herein relate generally to a semiconductor element and a method for manufacturing the same.

BACKGROUND

For example, there is a semiconductor element such as a transistor using a nitride semiconductor or the like. It is desirable to improve the characteristics of the semiconductor element.

BRIEF DESCRIPTION OF THE DRAWINGS

FIG. 4A and FIG. 4B are graphs illustrating a semiconductor element of a second reference example;

FIG. 9A to FIG. 9F are schematic cross-sectional views illustrating a method for manufacturing the semiconductor element according to the second embodiment;

DETAILED DESCRIPTION

Figure 1:
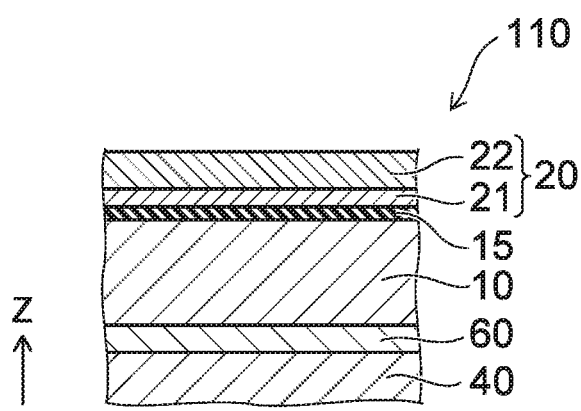
FIG. 1 is a schematic cross-sectional view illustrating a semiconductor element according to a first embodiment.

According to one embodiment, a semiconductor element includes a first nitride semiconductor region, a second nitride semiconductor region, and an intermediate region provided between the first nitride semiconductor region and the second nitride semiconductor region. A Si concentration in the intermediate region is not less than $1 \times 10^{18}/cm^3$ and not more than $1 \times 10^{19}/cm^3$. A charge density in the intermediate region is $3 \times 10^{17}/cm^3$ or less.

According to another embodiment, a method for manufacturing a semiconductor element includes processing a first nitride semiconductor region in an atmosphere including Si, performing surface processing of the first nitride semiconductor region after the processing, and forming a second nitride semiconductor region on the first nitride semiconductor region after the surface processing.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIRST EMBODIMENT

FIG. 1 is a schematic cross-sectional view illustrating a semiconductor element according to a first embodiment.

As shown in FIG. 1, the semiconductor element 110 according to the embodiment includes a first nitride semiconductor region 10, a second nitride semiconductor region 20, and an intermediate region 15. The intermediate region 15 is provided between the first nitride semiconductor region 10 and the second nitride semiconductor region 20.

A direction from the first nitride semiconductor region 10 toward the second nitride semiconductor region 20 is taken as a Z-axis direction. In the Z-axis direction, the intermediate region 15 is positioned between the first nitride semiconductor region 10 and the second nitride semiconductor region 20.

A base body 40 and a buffer layer 60 are provided in the example. The base body 40 is, for example, a silicon substrate. The base body 40 may be, for example, a sapphire substrate, a SiC substrate, or a GaN substrate. The base body 40 may be a nitride semiconductor layer formed on a substrate.

The buffer layer 60 is provided between the base body 40 and the first nitride semiconductor region 10. For example, the buffer layer 60 is formed on the base body 40. In one example, the buffer layer 60 includes AlN. In one example, the buffer layer 60 includes, for example, GaN. The buffer layer 60 may include a stacked body including multiple AlGaN layers. The buffer layer 60 may include, for example, multiple GaN layers and multiple AlN layers provided alternately. Examples of the buffer layer 60 are described below.

For example, the first nitride semiconductor region 10 is formed on the buffer layer 60. For example, the intermediate region 15 is formed on the first nitride semiconductor region 10. For example, the second nitride semiconductor region 20 is formed on the intermediate region 15.

In one example, the first nitride semiconductor region 10 includes at least one selected from the group consisting of GaN and AlGaN. In one example, the second nitride semiconductor region 20 includes at least one selected from the group consisting of GaN and AlGaN.

In the example, the second nitride semiconductor region 20 includes a first layer region 21 and a second layer region 22. The first layer region 21 is provided between the second layer region 22 and the intermediate region 15. The first layer region 21 includes $Al_{x1}Ga_{1-x1}N$ ($0 \leq x1 < 1$). The second layer region 22 includes $Al_{x2}Ga_{1-x2}N$ ($0 < x2 \leq 1$ and $x1 < x2$). In one example, the first layer region 21 includes GaN; and the second layer region 22 includes AlGaN. The second nitride semiconductor region 20 is, for example, a functional layer. In one example, x2 may be less than 1.

The intermediate region 15 includes Si. The intermediate region 15 may further include Ga and N. For example, the Si concentration in the intermediate region 15 is higher than the Si concentration in the first nitride semiconductor region 10. For example, the Si concentration in the intermediate region 15 is higher than the Si concentration in the second nitride semiconductor region 20. In one example, the thickness of the intermediate region 15 is not less than 0.25 nm and not more than 30 nm. For example, the thickness of the intermediate region 15 corresponds to the length of the intermediate region 15 along the Z-axis direction (the direction from the first nitride semiconductor region 10 toward the second nitride semiconductor region 20).

As described below, the Si concentration in the intermediate region 15 is not less than $1 \times 10^{18}/cm^3$ and not more than $1 \times 10^{19}/cm^3$. As described below, the charge density (e.g., the carrier density) in the intermediate region 15 is $3 \times 10^{17}/cm^3$ or less. In the case where the Si concentration has a maximum value, the Si concentration is, for example, the concentration at the peak.

By providing the intermediate region 15 including Si, for example, the dislocation density in the second nitride semiconductor region 20 can be reduced. Because the charge density is low (e.g., $3 \times 10^{17}/cm^3$ or less), for example, a high mobility can be obtained.

Examples of the characteristics of the semiconductor element will now be described. In the following examples, the first nitride semiconductor region 10 includes GaN. The second nitride semiconductor region 20 includes the first layer region 21 of GaN and the second layer region 22 of AlGaN.

Figure 2A:
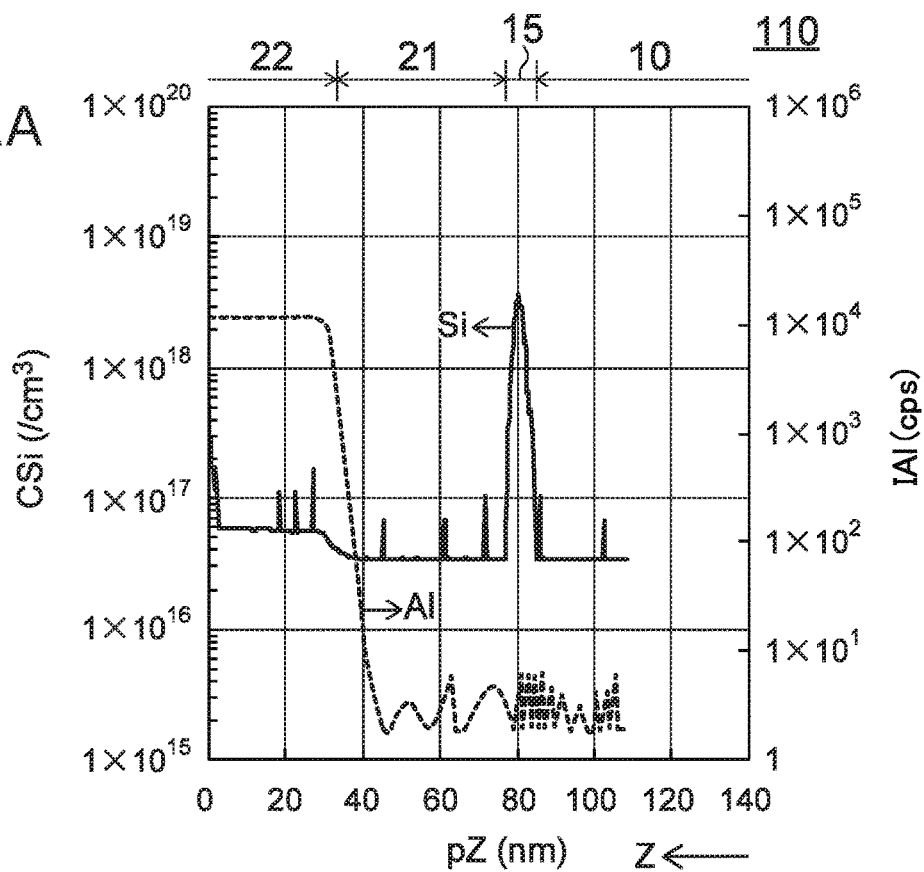
FIG. 2A and FIG. 2B are graphs illustrating the semiconductor element according to the first embodiment.
Figure 2B:
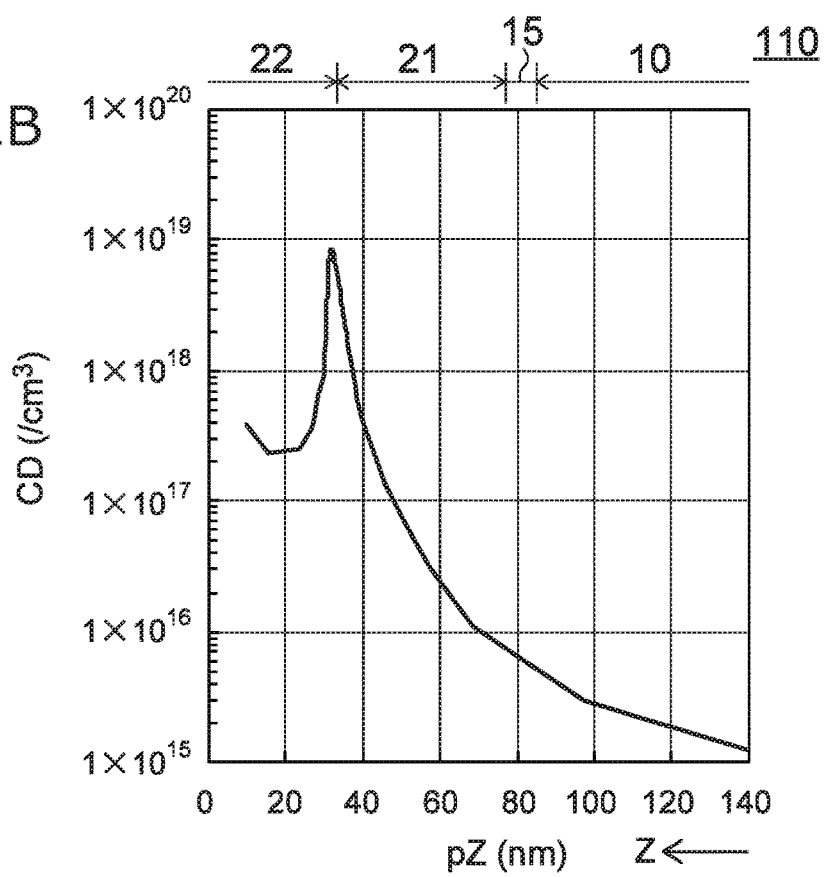

FIG. 2A and FIG. 2B are graphs illustrating the semiconductor element according to the first embodiment.

FIG. 2A illustrates the profiles of the elements of the semiconductor element 110. The vertical axis on the left of FIG. 2A is a Si concentration CSi ($/cm^3$). The vertical axis on the right of FIG. 2A is a secondary ion intensity IAl (cps) relating to Al. The vertical axis of FIG. 2B is a charge density CD ($/cm^3$). The Si concentration CSi and the secondary ion intensity IAl relating to Al are results of SIMS analysis. The charge density CD corresponds to the density of the electrons (the donors). In FIG. 2A and FIG. 2B, the horizontal axis is a position pZ (nm) in the Z-axis direction.

As shown in FIG. 2A, the region where Al is detected corresponds to the second layer region 22. The region where the Si concentration is high corresponds to the intermediate region 15. The region between the second layer region 22 and the intermediate region 15 corresponds to the first layer region 21.

As shown in FIG. 2A, the Si concentration in the intermediate region 15 is not less than $1 \times 10^{18}/cm^3$ and not more than $1 \times 10^{19}/cm^3$. The Si concentration in the intermediate region 15 may be, for example, not less than $2 \times 10^{18}/cm^3$ and not more than $5 \times 10^{18}/cm^3$. In the example, the peak concentration of Si in the intermediate region 15 is about $3 \times 10^{18}/cm^3$.

The Si concentration in the first nitride semiconductor region 10 is less than $5 \times 10^{17}/cm^3$. The Si concentration in the first nitride semiconductor region 10 may be, for example, $2 \times 10^{17}/cm^3$ or less. In the example, excluding the signal due to noise, the Si concentration in the first nitride semiconductor region 10 is $1 \times 10^{17}/cm^3$ or less.

On the other hand, the Si concentration in the first layer region 21 is less than $5 \times 10^{17}/cm^3$. The Si concentration in the first layer region 21 may be, for example, $2 \times 10^{17}/cm^3$ or less. In the example, excluding the signal due to noise, the Si concentration in the first layer region 21 is $1 \times 10^{17}/cm^3$ or less.

The Si concentration in the second layer region 22 is slightly high in the surface region (where the position pZ is 2 nm or less). Other than this region, the Si concentration in the second layer region 22 is less than $5 \times 10^{17}/cm^3$. The Si concentration in the second layer region 22 may be, for example, $2 \times 10^{17}/cm^3$ or less. In the example, excluding the signal due to noise, the Si concentration in the second layer region 22 is $2 \times 10^{17}/cm^3$ or less.

Thus, a region where the Si concentration is high locally is provided. This region corresponds to the intermediate region 15.

As shown in FIG. 2B, a peak of the charge density CD is observed at the vicinity of the interface between the first layer region 21 and the second layer region 22. For example, it is considered that the peak originates in a two-dimensional electron gas (2 DEG). On the other hand, the charge density CD in the intermediate region 15 is $3 \times 10^{17}/cm^3$ or less. In the example, the charge density CD in the intermediate region 15 is $1 \times 10^{16}/cm^3$ or less.

Thus, in the semiconductor element 110 according to the embodiment, the intermediate region 15 where the Si concentration is high locally is provided. For example, it is considered that three-dimensional growth occurs when forming (performing crystal growth of) the second nitride semiconductor region 20 on such an intermediate region 15. Thereby, dislocations can be reduced.

Although the Si concentration is high in the intermediate region 15, the charge density CD in the intermediate region 15 is low. Thereby, unfavorable effects on the electrical characteristics are suppressed. For example, unfavorable effects of the charge of the intermediate region 15 on a current using the two-dimensional electron gas can be suppressed. For example, the dislocations can be reduced while maintaining a high mobility based on the two-dimensional electron gas.

In the embodiment, it is possible to improve the characteristics while suppressing the unfavorable effects on the electrical characteristics.

Figure 3A:
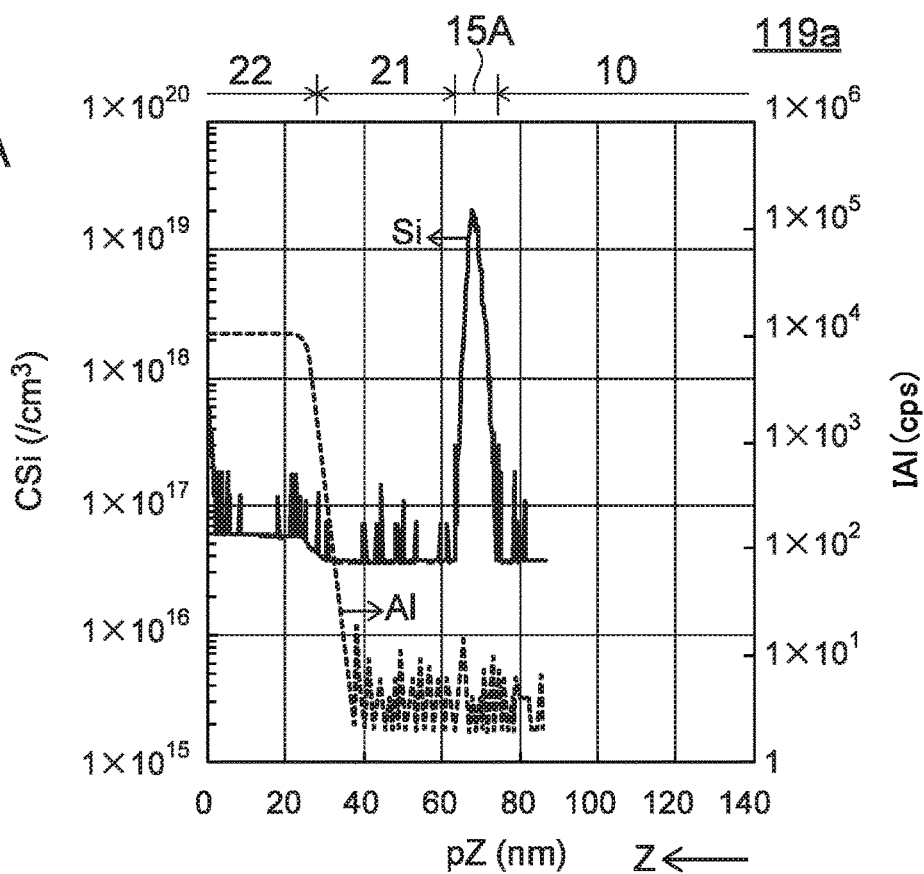
FIG. 3A and FIG. 3B are graphs illustrating a semiconductor element of a first reference example.
Figure 3B:
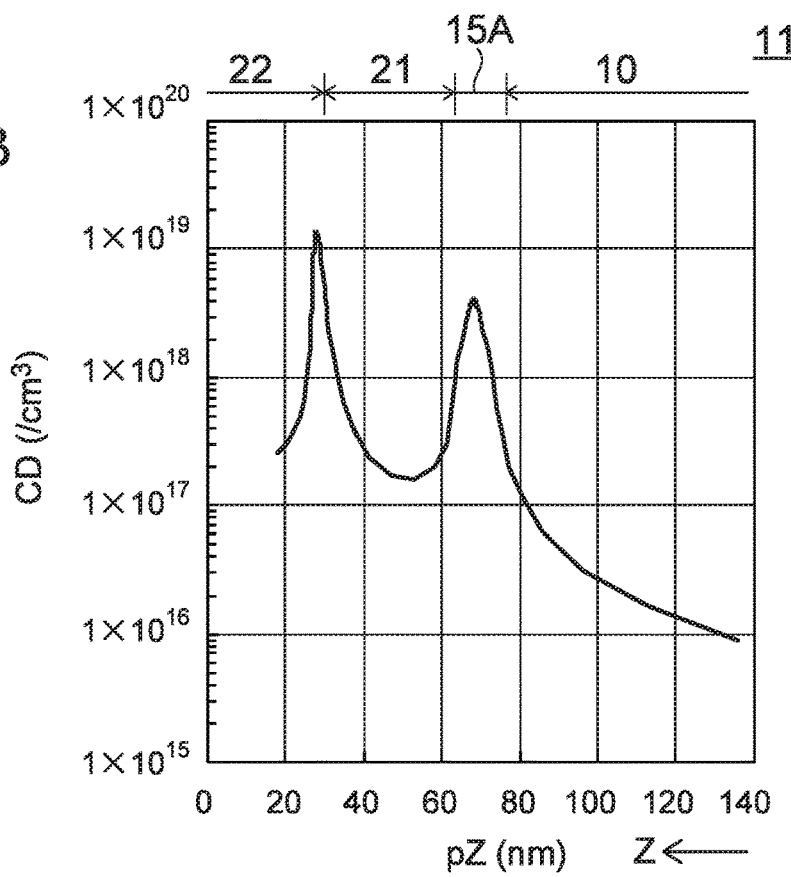

FIG. 3A and FIG. 3B are graphs illustrating a semiconductor element of a first reference example.

These figures illustrate characteristics of the semiconductor element 119a of the first reference example.

FIG. 3A illustrates the profiles of the elements of the semiconductor element 119a. As shown in FIG. 3A, the second layer region 22, the first layer region 21, an intermediate region 15A, and the first nitride semiconductor region 10 are provided in the semiconductor element 119a as well. In the semiconductor element 119a, the Si concentration in the intermediate region 15A is about $2 \times 10^{19}/cm^3$.

In the semiconductor element 119a as shown in FIG. 3B, the charge density CD has two peaks. One of the peaks originates in the two-dimensional electron gas. The other one of the peaks corresponds to the intermediate region 15A. The charge density CD in the intermediate region 15A is about $5 \times 10^{18}/cm^3$. In the semiconductor element 119a, unfavorable effects on the electrical characteristics occur. For example, the mobility decreases.

Examples of measurement results of the mobility will now be described.

In the semiconductor element 110 according to the embodiment, the mobility of the electrons is 1700 $cm^2/Vs$. In the semiconductor element 119a of the first reference example, the mobility of the electrons is 510 $cm^2/Vs$. It is considered that this is because in the first reference example, the electrons inside the two-dimensional electron gas (2 DEG) are scattered by the charge (the carriers) of the intermediate region 15. Thus, a high mobility is obtained due to the intermediate region 15 having the low charge density CD. For example, the information that relates to the mobility is obtained by a Hall effect measurement.

FIG. 4A and FIG. 4B are graphs illustrating a semiconductor element of a second reference example. These figures illustrate characteristics of the semiconductor element 119b of the second reference example. FIG. 4A illustrates the profiles of the elements of the semiconductor element 119b. An intermediate region is not provided in the semiconductor element 119b of the second reference example. In the semiconductor element 119b as shown in FIG. 4B, the charge density CD has one peak. The mobility of the second reference example is 1600 cm$^2$/Vs. In the second reference example, a high Si concentration is not provided in the region including the first nitride semiconductor region 10 and the second nitride semiconductor region 20. The mobility of the second reference example is higher than the mobility of the first reference example. However, the mobility of the second reference example is lower than the mobility of the embodiment. Because the intermediate region is not provided in the second reference example, the dislocation density is high; and it is difficult to obtain sufficiently high crystal quality. Thereby, it is difficult to obtain a sufficiently high mobility.

Figure 5A:
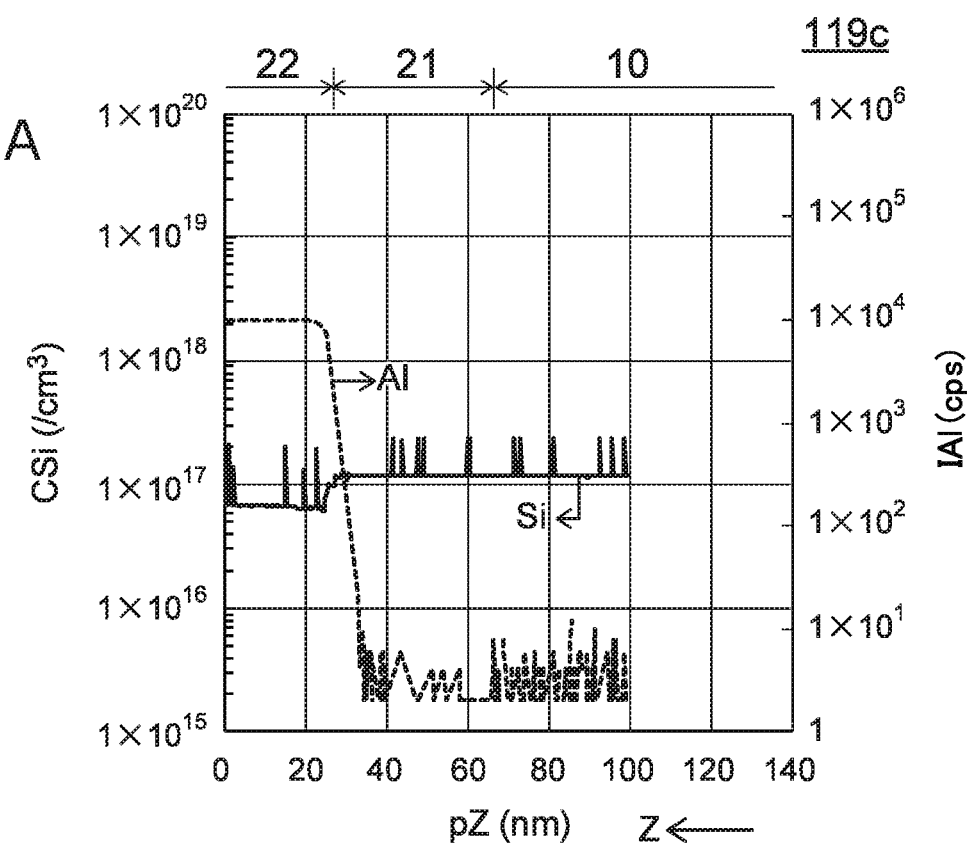
FIG. 5A and FIG. 5B are graphs illustrating a semiconductor element of a third reference example.
Figure 5B:
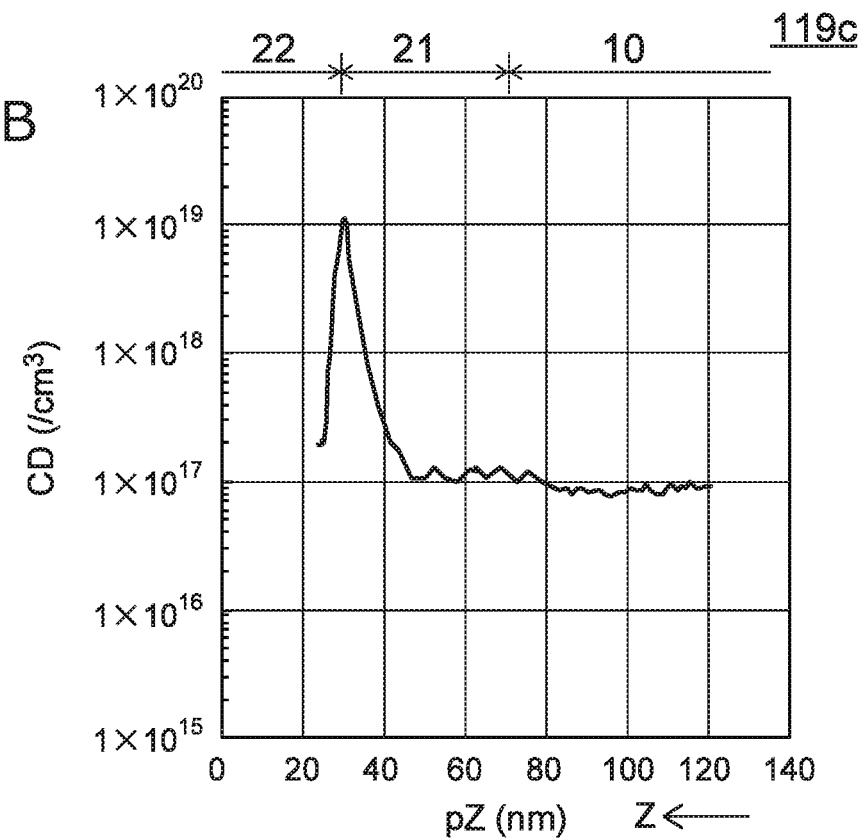

FIG. 5A and FIG. 5B are graphs illustrating a semiconductor element of a third reference example. These figures illustrate characteristics of the semiconductor element 119c of the third reference example. FIG. 5A illustrates the profiles of the elements of the semiconductor element 119c. In the semiconductor element 119c of the third reference example, the intermediate region is not provided; and the first layer region 21 and the first nitride semiconductor region 10 include a low concentration of Si. In the semiconductor element 119c, the first layer region 21 and the first nitride semiconductor region 10 are n-type nitride semiconductor regions. In the semiconductor element 119c as shown in FIG. 5B, the charge density CD has one peak. The mobility of the third reference example is 1150 cm$^2$/Vs. The mobility of the third reference example is higher than the mobility of the first reference example. However, the mobility of the third reference example is lower than the mobility of the embodiment. Because the intermediate region is not provided in the third reference example, the dislocation density is high; and it is difficult to obtain sufficiently high crystal quality. Thereby, it is difficult to obtain a sufficiently high mobility.

Thus, according to the embodiment, a semiconductor element can be provided in which the characteristics can be improved.

Here, a parameter P that relates to the relationship between the charge density CD and the Si concentration CSi is introduced. The parameter P is the ratio of the charge density CD in the intermediate region 15 or 15A to the Si concentration CSi in the region.

In one example of the semiconductor element 110 recited above, the Si concentration CSi in the intermediate region 15 is not less than $1 \times 10^{18}$/cm$^3$ and not more than $1 \times 10^{19}$/cm$^3$; and the charge density CD in the intermediate region 15 is $3 \times 10^{17}$/cm$^3$ or less. In such a case, the parameter P is 0.01 or less.

In the first reference example recited above, the Si concentration CSi in the intermediate region 15A is about $1.5 \times 10^{19}$/cm$^3$; and the charge density CD in the intermediate region 15A is about $5 \times 10^{18}$/cm$^3$. In such a case, the parameter P is 0.22.

The parameter P is not derived for the second and third reference examples recited above.

In the embodiment, for example, it is favorable for the parameter P recited above to be less than 0.33. The parameter P is, for example, 0.1 or less. The parameter P may be, for example, 0.05 or less. The parameter P may be, for example, 0.01 or less.

An example of a method for measuring the charge density CD recited above will now be described.

FIG. 6A, FIG. 6B, FIG. 7A, FIG. 7B, FIG. 8A, and FIG. 8B are graphs illustrating characteristics of the semiconductor elements.

Figure 6A:
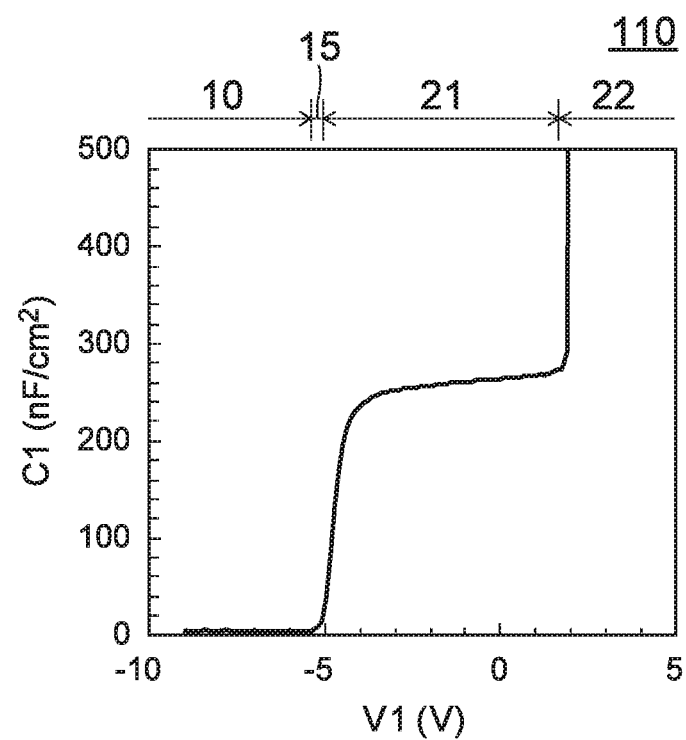
FIG. 6A and FIG. 6B are graphs illustrating characteristics of the semiconductor elements.
Figure 6B:
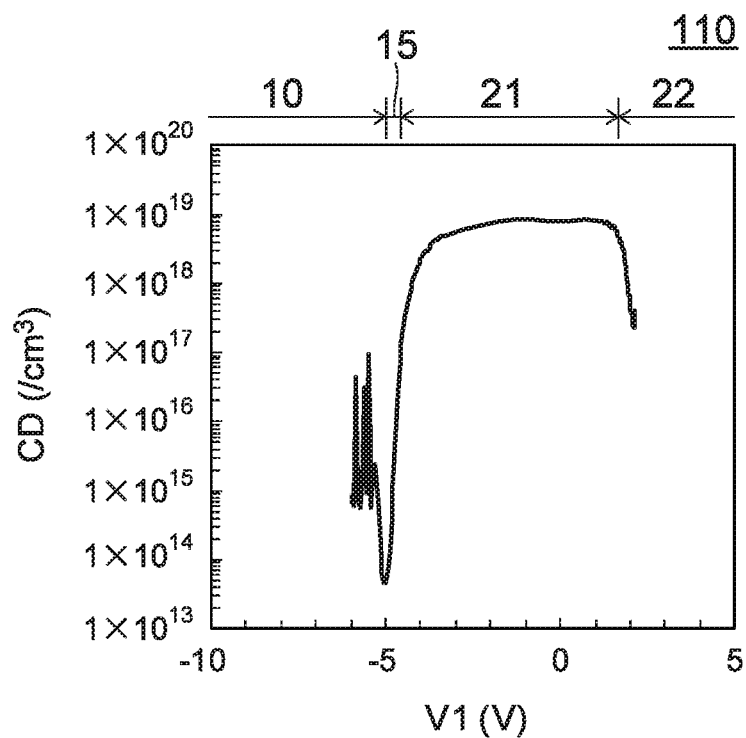
Figure 7A:
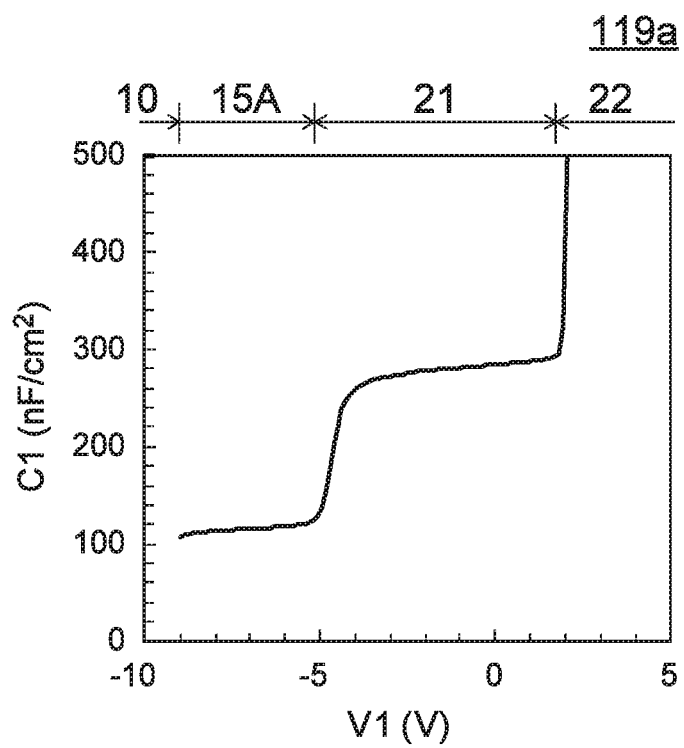
FIG. 7A and FIG. 7B are graphs illustrating characteristics of the semiconductor elements.
Figure 7B:
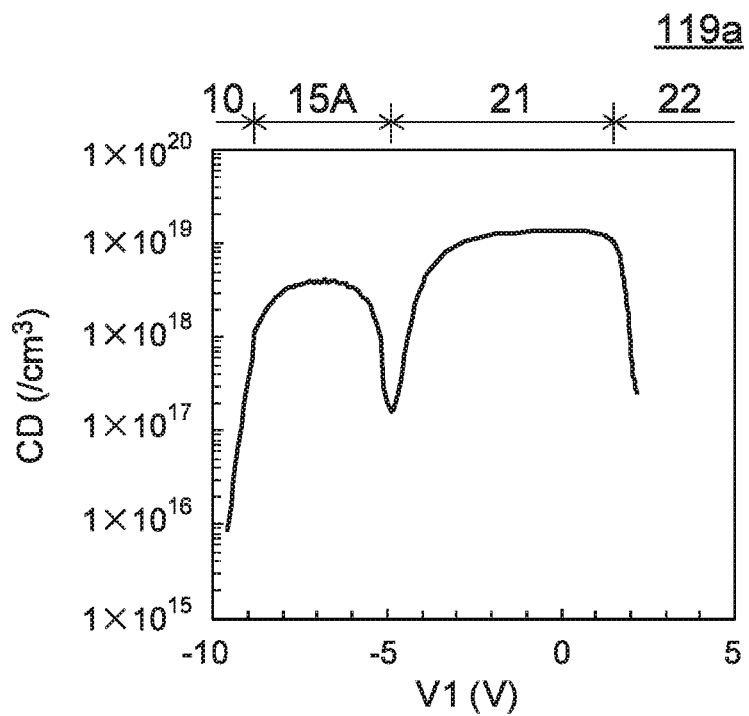
Figure 8A:
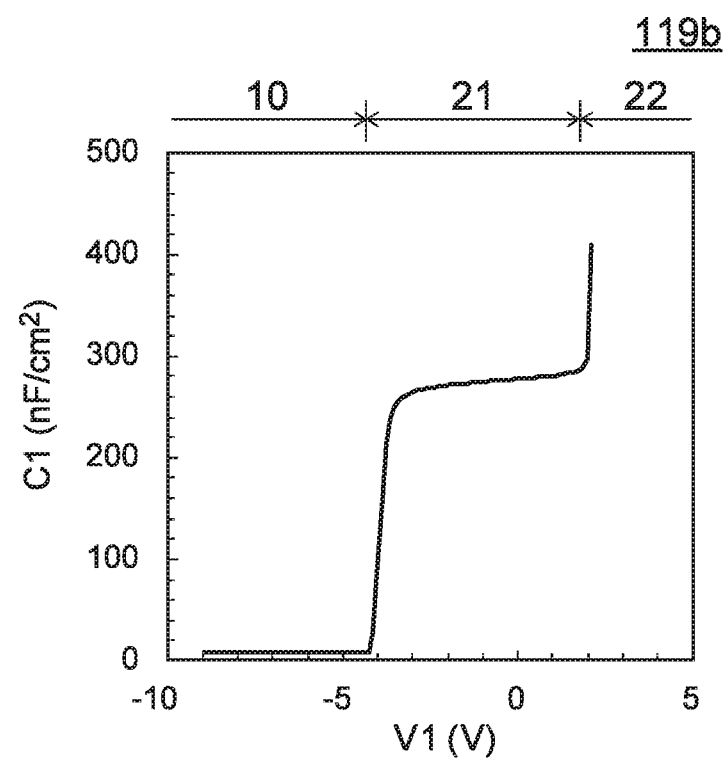
FIG. 8A and FIG. 8B are graphs illustrating characteristics of the semiconductor elements.
Figure 8B:
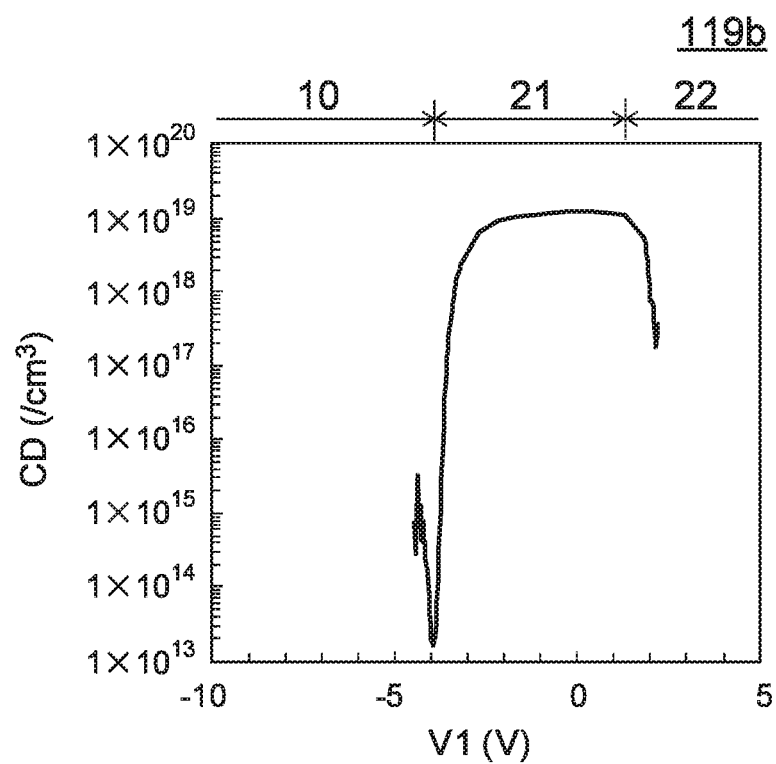

FIG. 6A and FIG. 6B correspond to the semiconductor element 110 according to the embodiment. FIG. 7A and FIG. 7B correspond to the semiconductor element 119a of the first reference example. FIG. 8A and FIG. 8B correspond to the semiconductor element 119b of the second reference example. In these figures, the horizontal axis corresponds to the voltage (an applied voltage V1) applied between the base body 40 and the second nitride semiconductor region 20. In FIG. 6A, FIG. 7A, and FIG. 8A, the vertical axis corresponds to an electrical capacitance C1 of the depletion layer between the base body 40 and the second nitride semiconductor region 20. In FIG. 6B, FIG. 7B, and FIG. 8B, the vertical axis corresponds to the charge density CD.

For example, an electrode is formed on the second nitride semiconductor region 20 side; and a Schottky junction is formed. For example, the second nitride semiconductor region 20 side is set to be positive; the base body 40 side is set to be negative; and the measurement of the capacitance-voltage characteristic (the C-V characteristic) is performed. Thereby, the measurement results of the capacitance-voltage characteristic (the C-V characteristic) such as those shown in FIG. 6A, FIG. 7A, and FIG. 8A are obtained.

The charge density distribution (the concentration) of the region depleted by a micro change dV when the applied voltage is changed from V to V+dV is taken to be a constant. W is the width of the depletion region. $N_d(W)$ is the charge density distribution in the depletion region. The charge density distribution is provided by the following Formula (1).

$$N_d(W)=C^3/((q\varepsilon_0\varepsilon_s A^2)\cdot(dC/dV)) \quad (1)$$

In Formula (1), "q" is the elementary charge. "$\varepsilon_0$" is the dielectric constant of a vacuum. "$\varepsilon_s$" is the relative dielectric constant of the second nitride semiconductor region 20. "A" is the surface area of the electrode (the contact region or the Schottky junction region) when measuring the electrical capacitance. "C" is the electrical capacitance. "V" is the applied voltage. The width W of the depletion region corresponds to the distance from the electrode.

The width W of the depletion region is provided by the following Formula (2).

$$W=\varepsilon_0\varepsilon_s A/C \quad (2)$$

Accordingly, from the applied voltage value and the electrical capacitance value of the capacitance-voltage characteristic (the C-V characteristic), for example, the charge density distribution $N_d(W)$ in the width W of the depletion region can be obtained based on Formula (1) and Formula (2). FIG. 6B, FIG. 7B, and FIG. 8B illustrate the charge density CD with respect to the applied voltage V1.

The distribution along the thickness direction of the charge density CD is obtained from these results. Based on such results, the characteristics illustrated in FIG. 2B, FIG. 3B, and FIG. 4B are obtained.

SECOND EMBODIMENT

The embodiment relates to a method for manufacturing a semiconductor element.

An example of an overview of the method for manufacturing the semiconductor element 110 according to the embodiment will now be described.

For example, processing of the first nitride semiconductor region 10 is performed in an atmosphere including Si. After this processing, surface processing of the first nitride semiconductor region 10 is performed. After the surface processing, the second nitride semiconductor region 20 is formed on the first nitride semiconductor region 10.

For example, the first nitride semiconductor region 10 is formed on the buffer layer 60 provided on the base body 40. For example, crystal growth of the first nitride semiconductor region 10 is performed. Then, after the surface processing, crystal growth of the second nitride semiconductor region 20 is performed on the first nitride semiconductor region 10.

In one example, for example, the surface processing may include a first processing including irradiating UV light. For example, the irradiation of the UV light is performed in an atmosphere including oxygen.

In one example, the surface processing may include a second processing using an alkaline liquid. In one example, the second processing (the processing using the alkaline liquid) is performed after the first processing (the irradiation of the UV light).

In one example, the surface processing may include a third processing using a liquid including an acid (e.g., at least one selected from the group consisting of hydrochloric acid, nitric acid, and hydrofluoric acid). The third processing is performed between the first processing and the second processing.

An example of the method for manufacturing the semiconductor element 110 according to the embodiment will now be described.

FIG. 9A to FIG. 9F are schematic cross-sectional views illustrating the method for manufacturing the semiconductor element according to the second embodiment.

As shown in FIG. 9A, the buffer layer 60 and the first nitride semiconductor region 10 are sequentially formed by epitaxial growth on the base body 40. For example, the formation is performed inside a chamber of an epitaxial growth apparatus.

The processing body (the base body 40, the buffer layer 60, and the first nitride semiconductor region 10) is removed from the chamber. The surface of the first nitride semiconductor region 10 contacts air.

Thereby, as shown in FIG. 9B, a substance 18 that includes Si (e.g., a compound including Si) adheres to the surface of the first nitride semiconductor region 10. In one example, the substance 18 includes Si and oxygen. The substance 18 includes, for example, siloxane. In one example, the substance 18 may include Si and C (carbon).

As shown in FIG. 9C, UV light is irradiated on the surface of the first nitride semiconductor region 10 (the first processing). For example, an excimer lamp or a mercury lamp is used as the light source of the UV light. The peak wavelength of the UV light emitted from the excimer lamp is, for example, about 172 nm. The peak wavelength of the mercury lamp is, for example, 185 nm or 254 nm. By the irradiation of the UV light, for example, the substance 18 that includes Si (the compound including Si) and is adhered to the first nitride semiconductor region 10 is oxidized. By the irradiation of the UV light, for example, an oxide 18a (Si oxide) that includes Si is formed. By the irradiation of the UV light, for example, an oxide (Ga oxide) that includes Ga also may be formed.

For example, the UV light is irradiated in an atmosphere including oxygen. For example, the oxidization of the surface of the first nitride semiconductor region 10 is promoted. It is favorable for the oxygen concentration in the atmosphere to be not less than 1% and not more than 25%. In the case where the oxygen concentration in the atmosphere is less than 0.1%, for example, the oxidation effect is not sufficient; and the formation of oxide is not sufficient. In the case where the oxygen concentration in the atmosphere is greater than 40%, for example, the absorption of the UV light by the oxygen is large; and the formation of oxide is not sufficient. When the oxygen concentration in the atmosphere is not less than 1% and not more than 25%, the oxidation effect is obtained more effectively, and the oxide is formed more effectively, for example. It is more favorable for the oxygen concentration in the atmosphere to be not less than 2% and not more than 10%.

In one example as shown in FIG. 9D, the surface of the first nitride semiconductor region 10 irradiated with the UV light is caused to contact an atmosphere (a liquid or a gas) including an acid (the third processing). For example, the atmosphere (the liquid) that includes the acid includes, for example, at least one selected from the group consisting of hydrochloric acid, nitric acid, and hydrofluoric acid. Due to the liquid (the acidic aqueous solution), the amount of the oxide 18b (the Ga oxide or the Si oxide) at the surface of the first nitride semiconductor region 10 is reduced (e.g., etched).

In one example as shown in FIG. 9E, the surface of the first nitride semiconductor region 10 irradiated with the UV light is caused to contact an alkaline liquid (the second processing). The alkaline liquid (e.g., the aqueous solution) includes, for example, at least one of a potassium hydroxide (KOH) aqueous solution or a tetramethyl ammonium hydroxide (TMAH) aqueous solution. Due to the liquid (the alkaline aqueous solution), the amount of the oxide 18c (the Ga oxide (e.g., the gallium oxide) or the Si oxide (e.g., the silicon oxide)) at the surface of the first nitride semiconductor region 10 is reduced (e.g., etched).

In one example, the processing that uses the alkaline aqueous solution is performed after the processing using the acidic aqueous solution. For example, processing that uses hydrochloric acid can be performed; subsequently, processing that uses hydrofluoric acid can be performed; further, processing that uses TMAH can be performed. Due to the processing using hydrochloric acid, for example, the Ga oxide (e.g., the gallium oxide) is removed. Due to the processing using hydrofluoric acid, for example, a portion of the silicon oxide (e.g., the silicon oxide) is removed. Due to the processing using TMAH, for example, at least one of the Ga oxide (e.g., the gallium oxide) or a portion of the silicon oxide (e.g., the silicon oxide) is removed. By such processing, a portion of the Si compound formed at the surface of the first nitride semiconductor region 10 may be removed.

Subsequently, the processing body is introduced to a chamber. As shown in FIG. 9F, the second nitride semiconductor region 20 is formed on the first nitride semiconductor region 10 after the surface processing. The intermediate region 15 is formed by the processing recited above.

The intermediate region 15 includes Si. It is considered that the Si is stabilized by the surface processing recited above. For example, it is considered that an electrically neutral and stable compound including Si and oxygen is formed. It is considered that the charge density CD is reduced thereby. For example, as shown in FIG. 2A, a peak of the Si concentration is observed in the intermediate region 15. As shown in FIG. 2B, a peak of the charge density CD is not observed in the intermediate region 15.

In one example, the intermediate region 15 may include oxygen. For example, electrical neutrality is obtained easily by including Si and oxygen.

In the example recited above, a substance that includes Si (e.g., a compound including Si) adheres to the surface of the first nitride semiconductor region 10 due to the surface of the first nitride semiconductor region 10 contacting air. In another example, the surface of the first nitride semiconductor region 10 may be caused to contact a gas including Si.

For example, the formation of the first nitride semiconductor region 10 and the second nitride semiconductor region 20 recited above is performed by metal-organic chemical vapor deposition (MOCVD), metal-organic vapor phase epitaxy (MOVPE), molecular beam epitaxy (MBE), hydride vapor phase epitaxy (HVPE), etc.

For example, in the case where MOCVD or MOVPE is used, the following can be used as the source material when forming each semiconductor layer. For example, TMGa (trimethylgallium) and TEGa (triethylgallium) can be used as the source material of Ga. For example, TMAl (trimethyl aluminum), etc., can be used as the source material of Al. For example, $NH_3$ (ammonia), MMHy (monomethylhydrazine), DMHy (dimethylhydrazine), etc., can be used as the source material of N. For example, TMIn (trimethylindium), TEIn (triethylindium), etc., can be used as the source material of In.

An example of the measurement results of the Si concentration and the charge density of samples made using the manufacturing method recited above will now be described.

First to fifth samples have structures similar to that of the semiconductor element 110.

In the first sample, the second nitride semiconductor region 20 is formed after causing the surface of the first nitride semiconductor region 10 to contact air. The surface processing is not performed for the first sample.

For the second sample, UV light is irradiated (the first processing) after causing the surface of the first nitride semiconductor region 10 to contact air. Subsequently, the second nitride semiconductor region 20 is formed.

For the third sample, UV light is irradiated (the first processing) after causing the surface of the first nitride semiconductor region 10 to contact air. The surface of the first nitride semiconductor region 10 irradiated with the UV light is caused to contact a tetramethyl ammonium hydroxide (TMAH) aqueous solution (the second processing). Subsequently, the second nitride semiconductor region 20 is formed. The third sample is the second sample for which the second processing is further performed.

For the fourth sample, UV light is irradiated (the first processing) after causing the surface of the first nitride semiconductor region 10 to contact air. The surface of the first nitride semiconductor region 10 irradiated with the UV light is caused to contact hydrochloric acid (the third processing) and a tetramethyl ammonium hydroxide (TMAH) aqueous solution (the second processing) in this order. Subsequently, the second nitride semiconductor region 20 is formed. The fourth sample is the third sample for which the third processing is further performed after the first processing.

For the fifth sample, processing that uses a tetramethyl ammonium hydroxide (TMAH) aqueous solution (the second processing) is performed after causing the surface of the first nitride semiconductor region 10 to contact air. Subsequently, UV light is irradiated on the surface of the first nitride semiconductor region 10 on which the processing is performed (the first processing). Subsequently, the second nitride semiconductor region 20 is formed. The fifth sample is the third sample for which the order of the first processing and the second processing is reversed.

For the sixth sample, UV light is irradiated (the first processing) after causing the surface of the first nitride semiconductor region 10 to contact air. The surface of the first nitride semiconductor region 10 irradiated with the UV light is caused to contact a tetramethyl ammonium hydroxide (TMAH) aqueous solution (the second processing) and hydrochloric acid (the third processing) in this order. Subsequently, the second nitride semiconductor region 20 is formed. The sixth sample is the fourth sample for which the order of the second processing and the third processing is reversed.

In the first sample, the Si concentration in the intermediate region 15 is $7 \times 10^{18}/cm^3$; and the charge density CD is $4.5 \times 10^{18}/cm^3$. The parameter P is 0.64.

In the second sample, the Si concentration in the intermediate region 15 is $4.2 \times 10^{18}/cm^3$; and the charge density CD is $2.8 \times 10^{17}/cm^3$. The parameter P is 0.07. The parameter P of the second sample is lower than the parameter P of the first sample. The Si concentration and the charge density CD can be reduced by the surface processing using the irradiation of the UV light. It is considered that the parameter P can be reduced by the surface processing using the irradiation of the UV light.

In the third sample, the Si concentration in the intermediate region 15 is $3.6 \times 10^{18}/cm^3$; and the charge density CD is $8 \times 10^{16}/cm^3$. The parameter P is 0.02. It is considered that the Si concentration and the charge density CD can be reduced further by performing the processing using the alkaline liquid (the second processing) in addition to the irradiation of the UV light as the surface processing. For example, it is considered that the parameter P can be reduced by the conditions of the third sample.

In the fourth sample, the Si concentration in the intermediate region 15 is $3 \times 10^{18}/cm^3$; and the charge density CD is $1 \times 10^{16}/cm^3$ or less. The parameter P is 0.01 or less. It is considered that the Si concentration and the charge density CD can be reduced further by performing the processing using the atmosphere (the liquid or the gas) including the acid (the third processing) in addition to the processing using the alkaline liquid (the second processing) and the irradiation of the UV light as the surface processing. For example, it is considered that the parameter P can be reduced by the conditions of the fourth sample.

In the fifth sample, the Si concentration in the intermediate region 15 is $3.8 \times 10^{18}/cm^3$; and the charge density CD is $2 \times 10^{17}/cm^3$ or less. The parameter P is 0.05. It is considered that the Si concentration and the charge density CD are reduced more easily by performing the second processing after the first processing in the case of including the processing using the alkaline liquid (the second processing) and the irradiation of the UV light (the first processing) as the surface processing. For example, it is considered that the parameter P can be reduced further by the conditions of the fifth sample.

In the sixth sample, the Si concentration in the intermediate region 15 is $3.6 \times 10^{18}/cm^3$; and the charge density CD is $4 \times 10^{17}/cm^3$ or less. The parameter P is 0.01. It is considered that the Si concentration and the charge density CD are reduced more easily by performing the first processing, the third processing, and the second processing in this order in the case of including the processing using the acidic liquid (the third processing), the processing using the alkaline liquid (the second processing), and the irradiation of the UV light (the first processing) as the surface processing. For example, it is considered that the parameter P can be reduced further by the conditions of the sixth sample.

In the first reference example recited above, for example, a δ-doped layer is formed as the intermediate region 15A. For example, crystal growth that uses $SiH_4$ (monosilane), $Si_2H_6$ (disilane), etc., as the source material of Si is performed. For example, the δ-doped layer is formed by supplying ammonia and monosilane at a temperature of 600° C. or more. In such a case, a peak of the charge density CD corresponding to the peak of the Si concentration CSi occurs (referring to FIG. 3A and FIG. 3B). In other words, it is considered that, for example, an electrically active compound including Si is formed as the δ-doped layer. It is considered that the peak of the charge density CD occurs thereby.

As described above, the intermediate region is not provided in the second reference example recited above. In the second reference example, the first nitride semiconductor region 10 is a non-doped nitride semiconductor region.

As described above, the intermediate region is not provided in the third reference example recited above. In the third reference example, the first nitride semiconductor region 10 is an n-type nitride semiconductor region including a low concentration of Si. In the third reference example, the Si concentration CSi in the first nitride semiconductor region 10 is about $1.2 \times 10^{17}/cm^3$; and the charge density CD in the first nitride semiconductor region 10 is about $1 \times 10^{17}/cm^3$ (referring to FIG. 5A and FIG. 5B).

Also, there is a fourth reference example in which the Si concentration of the configuration of the third reference example is high. In the fourth reference example, the first nitride semiconductor region 10 is an n-type nitride semiconductor region including a medium concentration of Si. In the fourth reference example, for example, the Si concentration CSi in the first nitride semiconductor region 10 is about $2 \times 10^{18}/cm^3$; and the charge density CD in the first nitride semiconductor region 10 is about $1.7 \times 10^{18}/cm^3$.

In the third and fourth reference examples, the ratio of the charge density CD to the Si concentration CSi is high. It is considered that the Si inside the nitride semiconductor of an n-type nitride semiconductor is electrically active. For example, a reference example also may be considered in which the first layer region 21 is an n-type nitride semiconductor region including a medium concentration of Si. It is considered that in such a reference example as well, the Si inside the nitride semiconductor is electrically active. For example, in these reference examples, it is difficult to obtain a high mobility.

Figure 10:
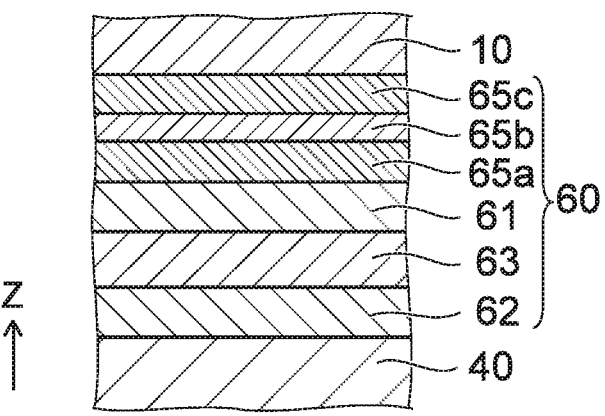
FIG. 10 is a schematic cross-sectional view illustrating a portion of the semiconductor element according to the embodiment.

FIG. 10 is a schematic cross-sectional view illustrating a portion of the semiconductor element according to the embodiment.

FIG. 10 shows an example of the buffer layer 60. In the example, the buffer layer 60 includes an AlN foundation layer 62, an AlGaN foundation layer 63, and a GaN foundation layer 61. The AlN foundation layer 62 is provided on the base body 40. The AlGaN foundation layer 63 is provided on the AlN foundation layer 62. The GaN foundation layer 61 is provided on the AlGaN foundation layer 63. The base body 40 is, for example, a silicon substrate.

In the example, the buffer layer 60 includes a GaN intermediate layer 65a, a high Al composition layer 65b, and a low Al composition layer 65c. The GaN intermediate layer 65a is provided between the low Al composition layer 65c and the GaN foundation layer 61. The high Al composition layer 65b is provided between the low Al composition layer 65c and the GaN intermediate layer 65a. The high Al composition layer 65b and the low Al composition layer 65c include nitride semiconductors. The composition ratio of Al in the high Al composition layer 65b is higher than the composition ratio of Al in the low Al composition layer 65c. The GaN intermediate layer 65a, the high Al composition layer 65b, and the low Al composition layer 65c are included in one stacked structure. In the embodiment, the buffer layer 60 may include multiple stacked structures. For example, the appropriate stress can be stored; for example, cracks, etc., can be suppressed.

Figure 11:
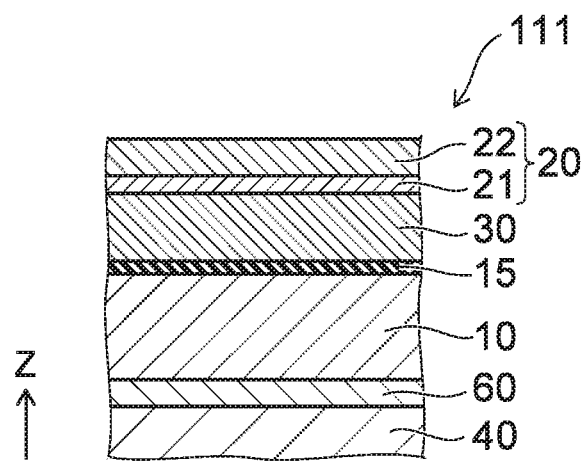
FIG. 11 is a schematic cross-sectional view illustrating a semiconductor element according to the embodiment.

FIG. 11 is a schematic cross-sectional view illustrating a semiconductor element according to the embodiment.

As shown in FIG. 11, the semiconductor element 111 according to the embodiment further includes a third nitride semiconductor region 30 in addition to the first nitride semiconductor region 10, the second nitride semiconductor region 20, and the intermediate region 15. The third nitride semiconductor region 30 is provided between the intermediate region 15 and the second nitride semiconductor region 20. Otherwise, the configuration of the semiconductor element 111 is similar to the configuration of the semiconductor element 110.

For example, the concentration of the impurity included in the first nitride semiconductor region 10 is different from the concentration of the impurity included in the third nitride semiconductor region 30. For example, the first nitride semiconductor region 10 includes carbon as the impurity. For example, the third nitride semiconductor region 30 includes carbon as the impurity. For example, the concentration of the impurity included in the first nitride semiconductor region 10 is higher than the concentration of the impurity included in the third nitride semiconductor region 30. For example, the concentration of the carbon included in the first nitride semiconductor region 10 is higher than the concentration of the carbon included in the third nitride semiconductor region 30. The concentration of the impurity (e.g., carbon) included in the first nitride semiconductor region 10 is, for example, not less than $1 \times 10^{17}/cm^3$ and not more than $1 \times 10^{19}/cm^3$. The concentration of the impurity (e.g., carbon) included in the third nitride semiconductor region 30 is, for example, not less than $1 \times 10^{15}/cm^3$ but less than $1 \times 10^{17}/cm^3$. By such impurities, for example, the mobility can be increased.

Figure 12A:
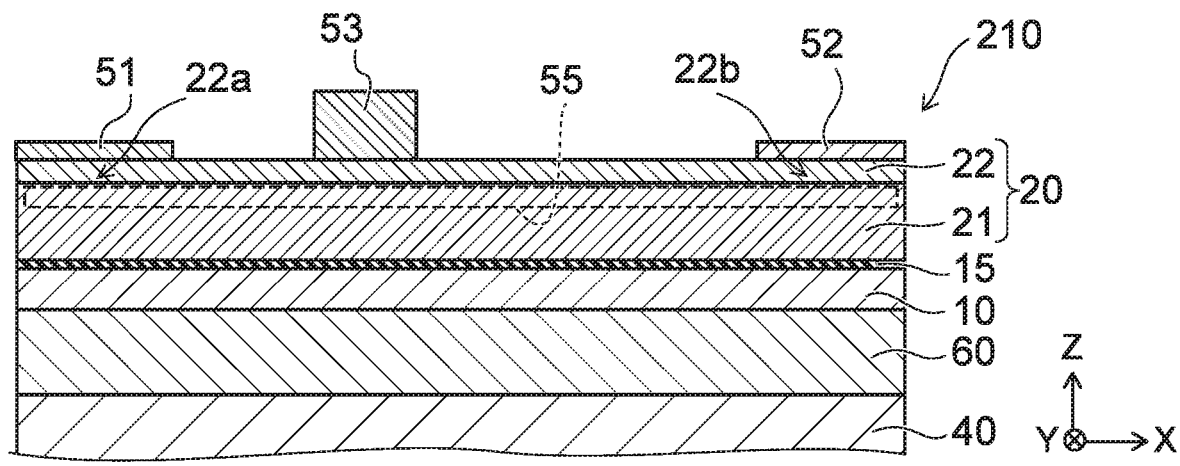
FIG. 12A and FIG. 12B are schematic cross-sectional views illustrating semiconductor elements according to the embodiment.
Figure 12B:
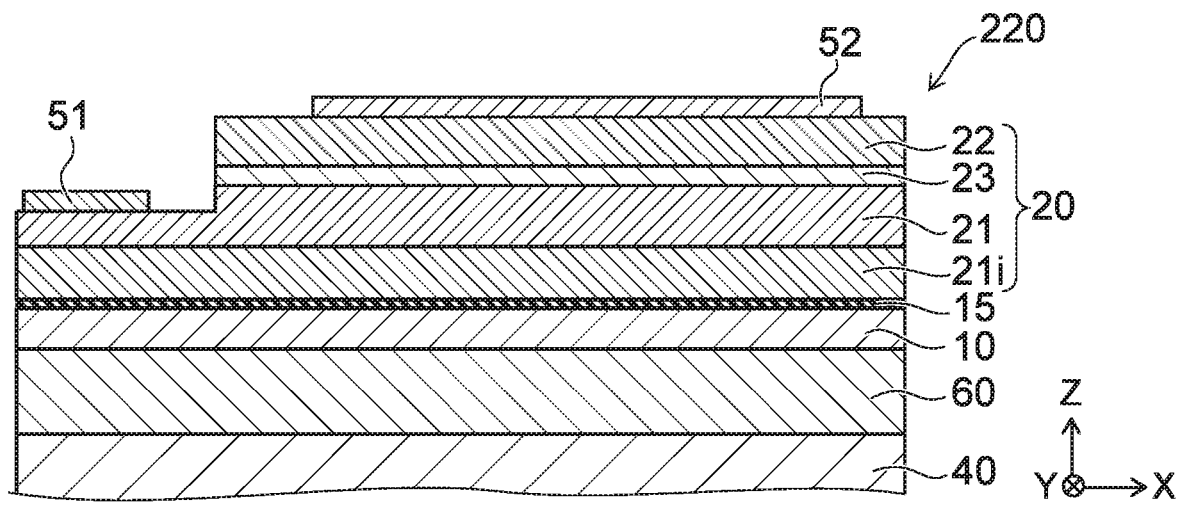

FIG. 12A and FIG. 12B are schematic cross-sectional views illustrating semiconductor elements according to the embodiment.

As shown in FIG. 12A, a semiconductor element 210 according to the embodiment includes first to third electrodes 51 to 53 in addition to the first nitride semiconductor region 10, the second nitride semiconductor region 20, and the intermediate region 15. In the example, the semiconductor element 210 further includes the base body 40 and the buffer layer 60.

In the example, the second nitride semiconductor region 20 includes the first layer region 21 and the second layer region 22. The first layer region 21 includes $Al_{x1}Ga_{1-x1}N$ (0≤x1<1). The second layer region 22 includes $Al_{x2}Ga_{1-x2}N$ (0<x2≤1 and x1<x2). The first layer region 21 is provided between the second layer region 22 and the intermediate region 15.

The second layer region 22 includes a first partial region 22a and a second partial region 22b. A second direction from the first partial region 22a toward the second partial region 22b crosses a first direction (a Z-axis direction) from the first nitride semiconductor region 10 toward the second nitride semiconductor region 20. In the example, the second direction corresponds to an X-axis direction.

The first electrode 51 is electrically connected to the first partial region 22a. The second electrode 52 is electrically connected to the second partial region 22b. The position of the third electrode 53 in the second direction (the X-axis direction) is between the position of the first electrode 51 in the second direction and the position of the second electrode 52 in the second direction.

A two-dimensional electron gas 55 is formed in the semiconductor element 210. The semiconductor element 210 is, for example, a gallium nitride (GaN)-based HEMT (High Electron Mobility Transistor).

For example, the dislocations can be reduced by the intermediate region 15. Also, the unfavorable effects of the charge of the intermediate region 15 on a current using the two-dimensional electron gas can be suppressed. For example, a high mobility is obtained. For example, a low ON-resistance is obtained.

The third nitride semiconductor region 30 (referring to FIG. 11) may be provided in the semiconductor element 210. The third nitride semiconductor region 30 is, for example, GaN. The thickness (the length along the Z-axis direction) of the third nitride semiconductor region 30 is, for example, not less than 10 nm and not more than 40 nm (e.g., 20 nm).

In the semiconductor element 210, the first layer region 21 includes GaN. The thickness of the first layer region 21 is, for example, 50 nm. The second layer region 22 includes AlGaN. The composition ratio of Al in the second layer region 22 is, for example, 0.2. The thickness of the second layer region 22 is, for example, not less than 5 nm and not more than 50 nm (e.g., 30 nm). For example, the second nitride semiconductor region 20 is formed by regrowth.

As shown in FIG. 12B, a semiconductor element 220 according to the embodiment includes the first electrode 51 and the second electrode 52 in addition to the first nitride semiconductor region 10, the second nitride semiconductor region 20, and the intermediate region 15. The second nitride semiconductor region 20 includes the first layer region 21, the second layer region 22, and a third layer region 23. The third layer region 23 is provided between the first layer region 21 and the second layer region 22. The first layer region 21 and the second layer region 22 include, for example, GaN. The third layer region 23 includes InGaN. The first layer region 21 is of a first conductivity type. The second layer region 22 is of a second conductivity type. The third layer region 23 is a light-emitting layer. In the example, the second nitride semiconductor region 20 includes a low impurity region 21i. The concentration of the impurity in the low impurity region 21i is lower than the concentration of the impurity in the first layer region 21 and lower than the concentration of the impurity in the second layer region 22. The impurity includes, for example, one of Si or Mg. The low impurity region 21i is, for example, i-GaN. In the example, the first electrode 51 is electrically connected to the first layer region 21. The second electrode 52 is electrically connected to the second layer region 22. The semiconductor element 220 is a semiconductor light-emitting element. The semiconductor element 220 is, for example, a laser or an LED.

A field effect transistor that has a heterostructure of AlGaN/GaN is an example of a semiconductor element using a nitride semiconductor. For example, the characteristics of the semiconductor element can be improved by reducing the defects inside the nitride semiconductor. For example, the characteristics of the semiconductor element can be improved by reducing the dislocations.

According to the embodiments, a semiconductor element and a method for manufacturing the semiconductor element can be provided in which the characteristics can be improved.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor elements such as nitride semiconductor regions, intermediate regions, basic bodies, buffer layers, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor elements, and methods for manufacturing the same practicable by an appropriate design modification by one skilled in the art based on the semiconductor elements, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor element, comprising:
   a first nitride semiconductor region;
   a second nitride semiconductor region;

an intermediate region provided between the first nitride semiconductor region and the second nitride semiconductor region; and a third nitride semiconductor region provided between the intermediate region and the second nitride semiconductor region, a Si concentration in the intermediate region being not less than $1\times10^{18}/cm^3$ and not more than $1\times10^{19}/cm^3$, a charge density in the intermediate region being $3\times10^{17}/cm^3$ or less, and a concentration of an impurity included in the first nitride semiconductor region is different from a concentration of an impurity included in the third nitride semiconductor region.

2. The element according to claim 1, wherein a length of the intermediate region along a direction from the first nitride semiconductor region toward the second nitride semiconductor region is not less than 0.25 nm and not more than 30 nm.

3. The element according to claim 1, wherein the intermediate region further includes Ga and N.

4. The element according to claim 1, wherein the intermediate region further includes oxygen.

5. The element according to claim 1, wherein a Si concentration in the first nitride semiconductor region is less than $5\times10^{17}/cm^3$.

6. The element according to claim 1, wherein the second nitride semiconductor region includes:

a first layer region including $Al_{x1}Ga_{1-x1}N$ ($0 \le x1 < 1$); and a second layer region including $Al_{x2}Ga_{1-x2}N$ ($0 < x2 \le 1$ and $x1 < x2$), and the first layer region is provided between the second layer region and the intermediate region.

7. The element according to claim 6, wherein a Si concentration in the first layer region is less than $5\times10^{17}/cm^3$.

8. The element according to claim 6, further comprising first to third electrodes, the second layer region including a first partial region and a second partial region, a second direction from the first partial region toward the second partial region crossing a first direction from the first nitride semiconductor region toward the second nitride semiconductor region, the first electrode being electrically connected to the first partial region, the second electrode being electrically connected to the second partial region, and a position of the third electrode in the second direction being between a position of the first electrode in the second direction and a position of the second electrode in the second direction.

9. The element according to claim 1, wherein the impurity included in the first nitride semiconductor region includes carbon.

10. A method for manufacturing a semiconductor element, comprising:

processing a first nitride semiconductor region in an atmosphere including Si;

performing surface processing of the first nitride semiconductor region after the processing; and forming a second nitride semiconductor region on the first nitride semiconductor region after the surface processing.

11. The method according to claim 10, wherein the surface processing includes a first processing including irradiating UV light.

12. The method according to claim 11, wherein the irradiating of the UV light is performed in an atmosphere including oxygen.

13. The method according to claim 11, wherein the surface processing further includes a second processing using an alkaline liquid.

14. The method according to claim 13, the alkaline liquid includes at least one selected from the group consisting of a potassium hydroxide (KOH) aqueous solution and a tetramethyl ammonium hydroxide (TMAH) aqueous solution.

15. The method according to claim 11, wherein
the surface processing further includes a second processing using an alkaline liquid, and
the second processing is performed after the first processing.

16. The method according to claim 15, wherein the surface processing further includes a third processing between the first processing and the second processing, the third processing using a liquid including at least one selected from the group consisting of hydrochloric acid, nitric acid, and hydrofluoric acid.

17. A semiconductor element, comprising:
a first nitride semiconductor region;
a second nitride semiconductor region;
an intermediate region provided between the first nitride semiconductor region and the second nitride semiconductor region; and
a third nitride semiconductor region provided between the intermediate region and the second nitride semiconductor region,
a Si concentration in the intermediate region being not less than $1\times10^{17}/cm^3$ and not more than $1\times10^{19}/cm^3$,
a charge density in the intermediate region being $3\times10^{17}/cm^3$ or less, and
an impurity included in the first nitride semiconductor region includes carbon.

18. The element according to claim 17, wherein a length of the intermediate region along a direction from the first nitride semiconductor region toward the second nitride semiconductor region is not less than 0.25 nm and not more than 30 nm.

19. The element according to claim 17, wherein the intermediate region further includes Ga and N.

20. The element according to claim 17, wherein the second nitride semiconductor region includes:
a first layer region including $Al_{x1}Ga_{1-x1}N$ ($0 \le x1 < 1$); and
a second layer region including $Al_{x2}Ga_{1-x2}N$ ($0 < x2 \le 1$ and $x1 < x2$); and
the first layer region is provided between the second layer region and the intermediate region.

21. The element according to claim 20, further comprising first to third electrodes,
the second layer region including a first partial region and a second partial region, a second direction from the first partial region toward the second partial region crossing a first direction from the first nitride semiconductor region toward the second nitride semiconductor region,
the first electrode being electrically connected to the first partial region,
the second electrode being electrically connected to the second partial region, and
a position of the third electrode in the second direction being between a position of the first electrode in the second direction and a position of the second electrode in the second direction.

22. A semiconductor element, comprising:
a first nitride semiconductor region;

a second nitride semiconductor region; and
an intermediate region provided between the first nitride semiconductor region and the second nitride semiconductor region,
a Si concentration in the intermediate region being not less than $1\times10^{18}/cm^3$ and not more than $1\times10^{19}/cm^3$,
a charge density in the intermediate region being $3\times10^{17}/cm^3$ or less, and
a ratio of the charge density in the intermediate region to the Si concentration being less than 0.33.

23. The element according to claim 22, wherein a length of the intermediate region along a direction from the first nitride semiconductor region toward the second nitride semiconductor region is not less than 0.25 nm and not more than 30 nm.

24. The element according to claim 22, wherein the intermediate region further includes Ga and N.

25. The element according to claim 22, wherein the second nitride semiconductor region includes:
a first layer region including $Al_{x1}Ga_{1-x1}N$ ($0\leq x1<1$); and
a second layer region including $Al_{x2}Ga_{1-x2}N$ ($0<x2\leq1$ and $x1<x2$); and
the first layer region is provided between the second layer region and the intermediate region.

26. The element according to claim 25, further comprising first to third electrodes,
the second layer region including a first partial region and a second partial region, a second direction from the first partial region toward the second partial region crossing a first direction from the first nitride semiconductor region toward the second nitride semiconductor region,
the first electrode being electrically connected to the first partial region,
the second electrode being electrically connected to the second partial region, and
a position of the third electrode in the second direction being between a position of the first electrode in the second direction and a position of the second electrode in the second direction.

27. A semiconductor element, comprising:
a first nitride semiconductor region;
a second nitride semiconductor region; and
an intermediate region provided between the first nitride semiconductor region and the second nitride semiconductor region, the intermediate region including silicon and oxygen,
a Si concentration in the intermediate region being not less than $1\times10^{18}/cm^3$ and not more than $1\times10^{19}/cm^3$, and
a charge density in the intermediate region being $3\times10^{17}/cm^3$ or less.

28. The element according to claim 27, wherein a length of the intermediate region along a direction from the first nitride semiconductor region toward the second nitride semiconductor region is not less than 0.25 nm and not more than 30 nm.

29. The element according to claim 27, wherein the intermediate region further includes Ga and N.

30. The element according to claim 27, wherein the second nitride semiconductor region includes:
a first layer region including $Al_{x1}Ga_{1-x1}N$ ($0\leq x1<1$); and
a second layer region including $Al_{x2}Ga_{1-x2}N$ ($0<x2\leq1$ and $x1<x2$); and
the first layer region is provided between the second layer region and the intermediate region.

31. The element according to claim 29, further comprising first to third electrodes,
the second layer region including a first partial region and a second partial region, a second direction from the first partial region toward the second partial region crossing a first direction from the first nitride semiconductor region toward the second nitride semiconductor region,
the first electrode being electrically connected to the first partial region,
the second electrode being electrically connected to the second partial region, and
a position of the third electrode in the second direction being between a position of the first electrode in the second direction and a position of the second electrode in the second direction.

\* \* \* \* \*